United States Patent
Bunce et al.

(10) Patent No.: US 7,099,203 B1
(45) Date of Patent: Aug. 29, 2006

(54) CIRCUIT AND METHOD FOR WRITING A BINARY VALUE TO A MEMORY CELL

(75) Inventors: Paul A. Bunce, Poughkeepsie, NY (US); John D. Davis, Wallkill, NY (US); Donald W. Plass, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 59 days.

(21) Appl. No.: 11/057,281

(22) Filed: Feb. 11, 2005

(51) Int. Cl.
*G11C 7/10* (2006.01)
*G11C 11/00* (2006.01)

(52) U.S. Cl. .................................. 365/189.08; 365/154
(58) Field of Classification Search ............ 365/189.08, 365/154, 156, 230.05
See application file for complete search history.

(56) References Cited

U.S. PATENT DOCUMENTS

| | | | | |
|---|---|---|---|---|
| 5,504,711 | A | * | 4/1996 | Lu .......................... 365/189.11 |
| 6,046,930 | A | * | 4/2000 | Ciraula et al. ............... 365/156 |
| 6,671,201 | B1 | * | 12/2003 | Masuda ....................... 365/154 |
| 6,674,670 | B1 | * | 1/2004 | Jeung ..................... 365/189.01 |
| 2004/0130933 | A1 | * | 7/2004 | Kanehara et al. ........... 365/154 |
| 2005/0024970 | A1 | | 2/2005 | Shore ......................... 365/222 |

\* cited by examiner

*Primary Examiner*—Anh Phung
(74) *Attorney, Agent, or Firm*—William A. Kinnaman, Jr.; Cantor Colburn LLP

(57) ABSTRACT

A circuit and a method for writing a binary value to a memory cell are provided. The circuit includes a first field-effect transistor having a first drain, a first drain, and a first gate operably coupled between the first drain and the first source. The first drain is operably coupled to a first memory cell. The first gate configured to receive a first data signal. The circuit further includes a second field-effect transistor having a second drain, a second source, and a second gate operably coupled between the second drain and the second source. The drain source is operably coupled to the first memory cell. The second gate is configured to receive a second data signal. The circuit further includes a first signal inverter having a first input terminal and a first output terminal. The first output terminal is operably coupled to both of the first and second sources. The first signal inverter is configured to output a first control signal on the first output terminal when the first input terminal receives a second control signal. When the first control signal has a second logic level and the first data signal has a first logic level and the second data signal has the second logic level, the first and second field-effect transistors induce the first memory cell to store a first binary value.

15 Claims, 3 Drawing Sheets

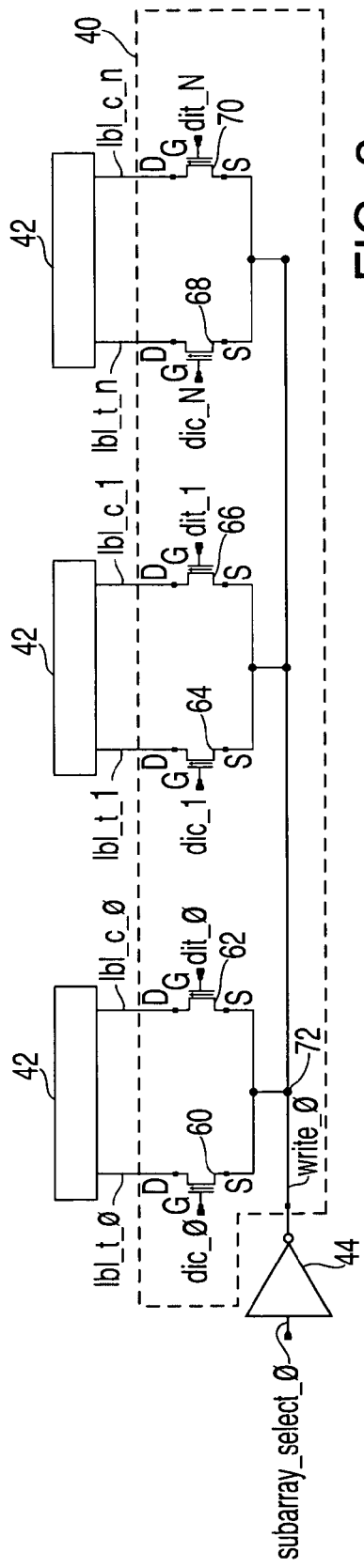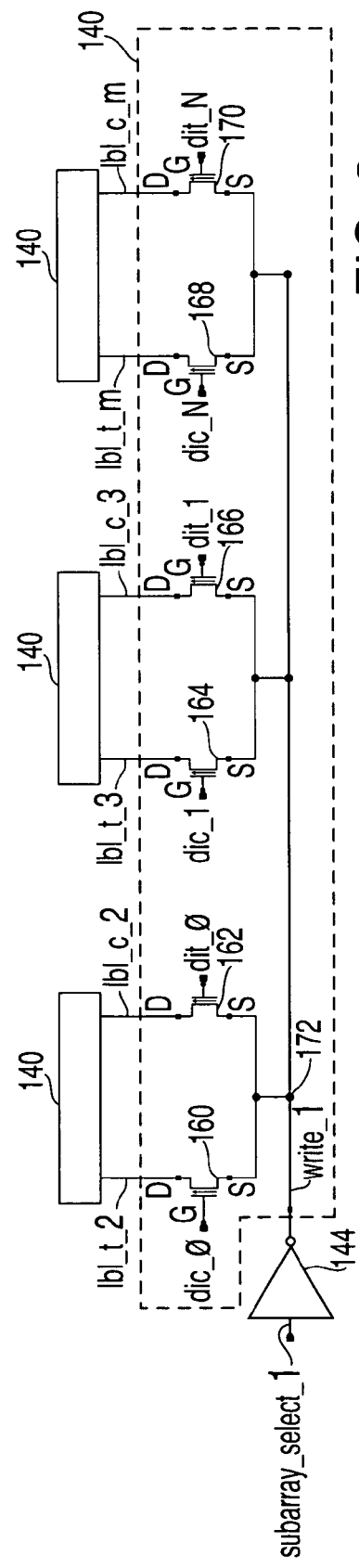

CIRCUIT AND METHOD FOR WRITING A BINARY VALUE TO A MEMORY CELL

FIELD OF INVENTION

This application relates to a circuit and a method for writing a binary value to a memory cell.

BACKGROUND OF INVENTION

Computers have been developed that utilize circuitry to write binary values to a memory cell array for storing the binary values. The circuitry utilizes a first and second pair of transistors each receiving an identical pair of data signals. The first and second pairs of transistors are coupled to first and second memory cells, respectively. When a binary value is to be written to the first memory cell, the first and second pair of transistors pull down voltages applied to the first and second memory cells, respectively, to ground voltages, even when the second memory cell is not selected for writing. Accordingly, electrical energy is wasted during each write cycle and undesired heat is generated.

Thus, there is a need for an improved circuit for writing a binary value to a memory cell.

SUMMARY OF INVENTION

A circuit for writing a binary value to a memory cell in accordance with an exemplary embodiment is provided. The circuit includes a first field-effect transistor having a first drain, a first source, and a first gate operably coupled between the first drain and the first source. The first drain is operably coupled to a first memory cell. The first gate configured to receive a first data signal. The circuit further includes a second field-effect transistor having a second drain, a second source, and a second gate operably coupled between the second drain and the second source. The second drain is operably coupled to the first memory cell. The second gate is configured to receive a second data signal. The circuit further includes a first signal inverter having a first input terminal and a first output terminal. The first output terminal is operably coupled to both of the first and second sources. The first signal inverter is configured to output a first control signal on the first output terminal when the first input terminal receives a second control signal. When the first control signal has a second logic level and the first data signal has a first logic level and the second data signal has the second logic level, the first and second field-effect transistors induce the first memory cell to store a first binary value.

A method for writing a binary value to a memory cell utilizing a circuit in accordance with another exemplary embodiment is provided. The circuit has a first field-effect transistor, a second field-effect transistor, and a first signal inverter. The first field-effect transistor has a first drain, a first source, and a first gate operably coupled between the first drain and the first source. The first drain is operably coupled to a first memory cell. The second field-effect transistor has a second drain, a second source, and a second gate operably coupled between the second drain and the second source. The second drain is operably coupled to the first memory cell. The first signal inverter has a first input terminal and a first output terminal. The first output terminal is operably coupled to the first and second sources of the first and second field-effect transistors. The method includes receiving a first data signal having a first logic level at the first gate of the first field-effect transistor. The method further includes receiving a second data signal having a second logic level at the second gate of the second field-effect transistor. The method further includes outputting a first control signal having the first logic level on the first output terminal of the first signal inverter when the first input terminal receives a second control signal, that induces the first and second field-effect transistors to store a first binary value in the first memory cell based on the first and second data signals.

Other systems and methods according to the embodiments will be or become apparent to one with skill in the art upon review of the following drawings and detailed description. It is intended that at all such additional systems and methods be within the scope of the present invention, and be protected by the accompanying claims.

BRIEF DESCRIPTION OF DRAWINGS

FIG. 2 is an electrical schematic of a first local write circuit utilized in the system of FIG. 1; and FIG. 3 is an electrical schematic of a second local write circuit utilized in the system of FIG. 1.

DESCRIPTION OF AN EMBODIMENT

Figures 1, 1A:
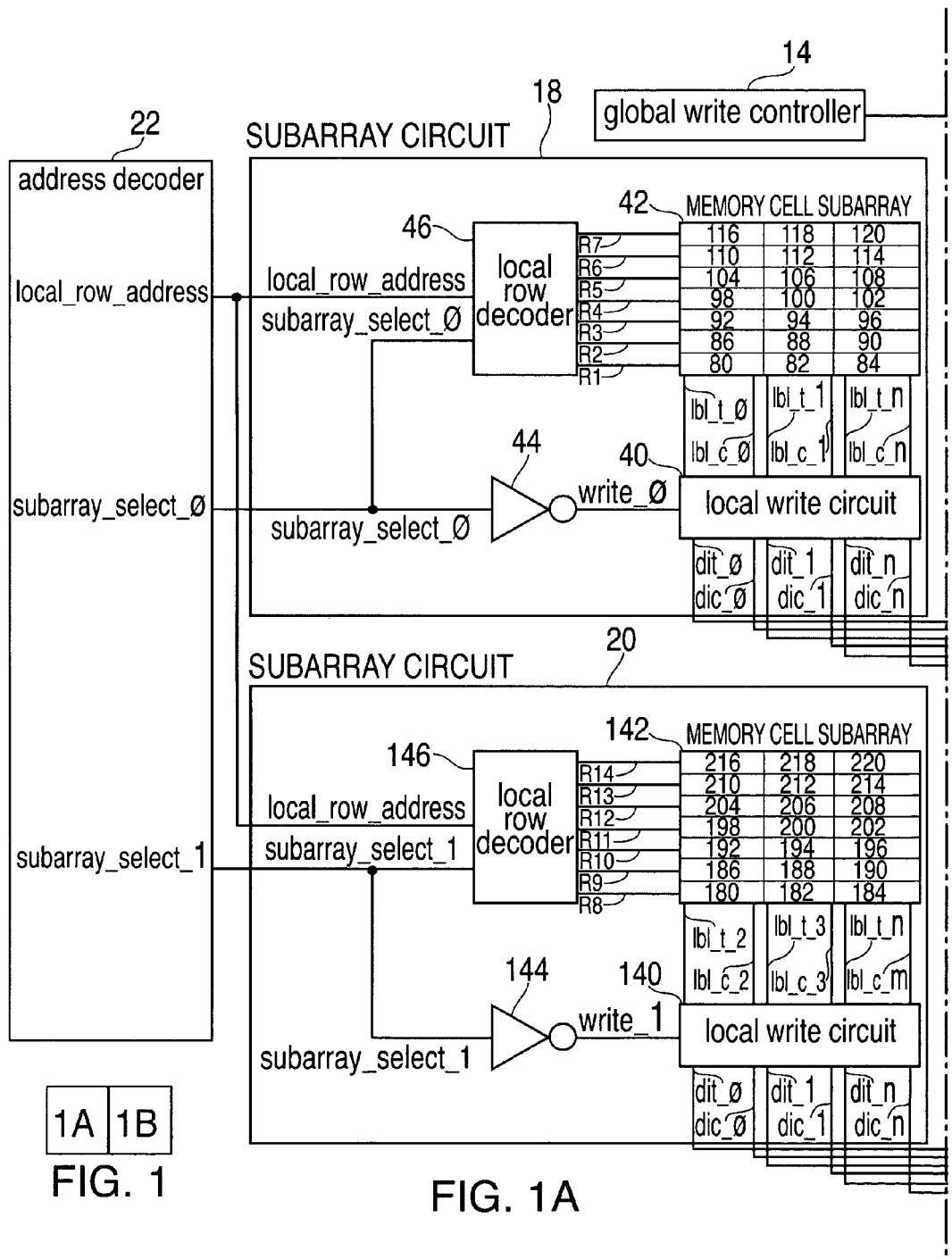
FIGS. 1A and 1B illustrate a system having a circuit for writing a binary value to a memory cell in accordance with an exemplary embodiment.
Figure 1B:
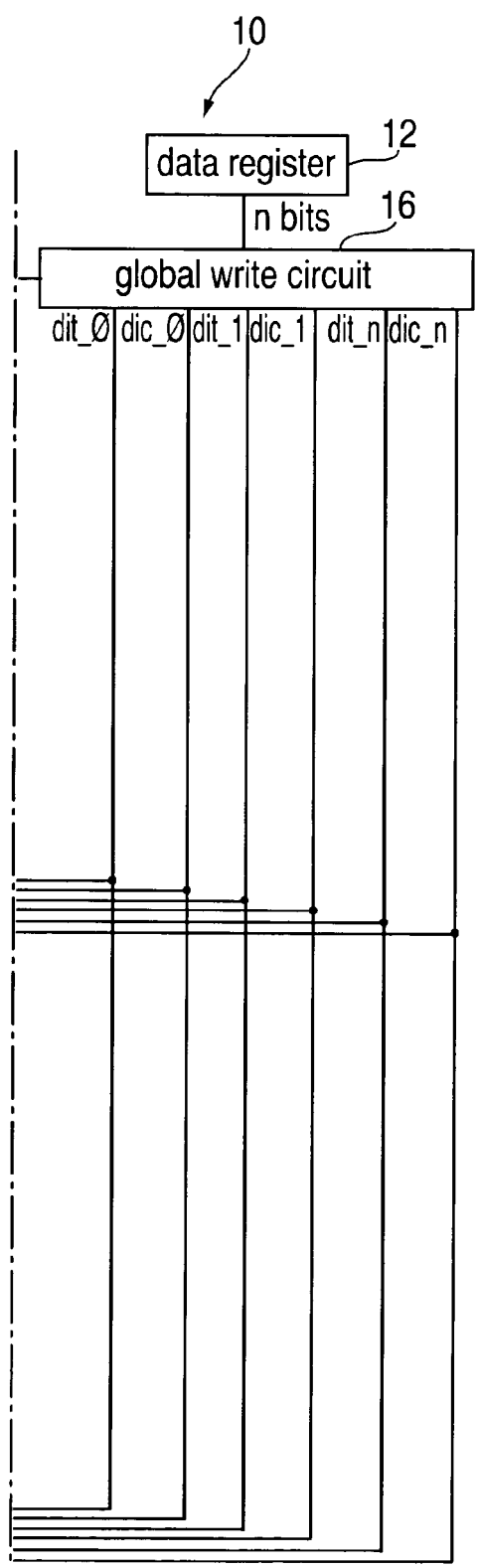

Referring to FIGS. 1A and 1B, a system 10 for writing binary values to memory cell subarrays is illustrated. The system 10 includes a data register 12, a global write controller 14, a global write circuit 16, a subarray circuit 18, a subarray circuit 20, and an address decoder 22.

The data register 12 is provided to temporarily store a plurality of binary values that will be written to one of the memory cell subarrays 42, 142. The data register 12 operably communicates with the global write circuit 16.

The global write circuit 16 is provided to transmit the binary data signals dit_0, dic_0, dit_1, dic_1, dit_n, and dic_n, indicative of binary values stored in the data register 12, to the local write circuits 40, 140 of the subarray circuits 18, 20, respectively. In particular, the global write circuit 16 is provided to transmit the signals dit_0, dic_0, dit_1, dic_1, dit_n, and dic_n in response to a write command signal received from the global write controller 14. The dic_0 signal is the logical complement of the dit_0 signal. In other words, when the dit_0 signal has a high logic level indicating a binary "1" value, the dic_0 signal has a low logic level indicating a binary "0" value. Similarly, the dic_1 signal is the logical complement of the signal dit_1. Further, the dic_n signal is the logical complement of the dit_n signal. In an alternate embodiment, the global write circuit 16 can write either a greater number of data signals or a smaller number of data signals, than data signals dit_0, dic_0, dit_1, dic_1, dit_n, and dic_n.

The global write controller 14 is provided to generate the write command signal that induces the global write circuit 16 to transmit the data signals dit_0, dic_0, dit_1, dic_1, dit_n, and dic_n. As shown, the global write controller 14 operably communicates with the global write circuit 16.

The subarray circuit 18 is provided to receive the binary data signals dit_0, dic_0, dit_1, dic_1, dit_n, and dic_n from the global write circuit 16 and to write the associated binary values to predetermined memory cells in the memory cell subarray 42. The subarray circuit 18 includes a local write circuit 40, a memory cell subarray 42, a signal inverter 44, and a local row decoder 46.

Referring to FIGS. 1A, 1B and 2, the local write circuit 40 includes the field-effect transistors 60, 62, 64, 66, 68, 70. Each of the field-effect transistors 60–70 includes a gate (G), a source (S), and a drain (D). The sources of the field-effect transistors 60–70 are electrically coupled to the node 72 which is further electrically coupled to an output terminal of the signal inverter 44.

The drains of the transistors 60, 62 are electrically coupled to all of the memory cells in a column of memory cells in the memory cell subarray 42. In particular, the drains of the transistors 60, 62 are electrically coupled to memory cells 80, 86, 92, 98, 104, 110, 116 in the memory cell subarray 42, one of which is selected by the local row decoder 46. For example, if the local row decoder 46 generates a signal R1 with a high logic level (e.g., a binary "1" value), a binary value will be written to the memory cell 80 when the write_0 signal indicates that a write to the memory cell subarray 42 is to be performed.

The drains of the transistors 64, 66 are electrically coupled to all of the memory cells in a column of memory cells in the memory cell subarray 42. In particular, the drains of the transistors 64, 66 are electrically coupled to memory cells 82, 88, 94, 100, 106, 112, 118 in the memory cell subarray 42, one of which is selected by the local row decoder 46. For example, if the local row decoder 46 generates a signal R2 with a high logic level (e.g., a binary "1" value), a binary value will be written to the memory cell 88 when the write_0 signal indicates that a write to the memory cell subarray 42 is to be performed.

The drains of the transistors 68, 70 are electrically coupled to all of the memory cells in a column of memory cells in the memory cell subarray 42. In particular, the drains of the transistors 68, 70 are electrically coupled to memory cells 84, 90, 96, 102, 108, 114, 120 in the memory cell subarray 42, one of which is selected by the local row decoder 46. For example, if the local row decoder 46 generates a signal R3 with a high logic level, a binary value will be written to the memory cell 96 when the write_0 signal indicates that a write to the memory cell subarray 42 is to be performed.

When the write_0 control signal from the signal inverter 44 indicates a binary "0" value, a write will be performed to the memory cell subarray 42. Thereafter, when dit_0 signal indicates a binary "1" value and the dic_0 signal indicates a binary "0" value, the field-effect transistors 62, 60, respectively output signals lbl_c_0, lbl_t_0, respectively, having low and high logic levels, respectively. In other words, the field-effect transistor 62 is turned "on" in response to the dit_0 signal indicating a binary "1" value, which causes its drain line coupled to a selected memory cell to be electrically grounded. Further, the field-effect transistor 60 is turned "off" in response to the dic_0 signal indicating a binary "0" value, and its drain line coupled to the selected memory cell is not electrically grounded. In response, a binary "1" value is stored in one of the memory cells 80, 86, 92, 98, 104, 110, 116 selected by the local row decoder 46.

Alternately, when the dit_0 signal indicates a binary "0" value and the dic_0 signal indicates a binary "1" value, the field-effect transistors 62, 60, respectively output signals lbl_c_0, lbl_t_0, respectively, having high and low logic levels, respectively. In other words, the field-effect transistor 62 is turned "off" in response to the dit_0 signal indicating a binary "0" value, and its drain line coupled to a selected memory cell is not electrically grounded. Further, the field-effect transistor 60 is turned "on" in response to the dic_0 signal indicating a binary "1" value, and its drain line coupled to the selected memory cell is electrically grounded. In response, a binary "0" value is stored in one of the memory cells 80, 86, 92, 98, 104, 110, 116 selected by the local row decoder 46.

When the dit_1 signal indicates a binary "1" value and the dic_1 signal indicates a binary "0" value, the field-effect transistors 66, 64, respectively output signals lbl_c_1, lbl_t_1, respectively, having low and high logic levels, respectively. In other words, the field-effect transistor 66 is turned "on" in response to the dit_1 signal indicating a binary "1" value, which causes its drain line coupled to a selected memory cell to be electrically grounded. Further, the field-effect transistor 64 is turned "off" in response to the dic_1 signal indicating a binary "0" value, and its drain line coupled to the selected memory cell is not electrically grounded. In response, a binary "1" value is stored in one of the memory cells 82, 88, 94, 100, 106, 112, 118 selected by the local row decoder 46.

Alternately, when the dit_1 signal indicates a binary "0" value and the dic_1 signal indicates a binary "1" value, the field-effect transistors 66, 64, respectively output signals lbl_c_1, lbl_t_1, respectively, having high and low logic levels, respectively. In other words, the field-effect transistor 66 is turned "off" in response to the dit_1 signal indicating a binary "0" value, and its drain line coupled to a selected memory cell is not electrically grounded. Further, the field-effect transistor 64 is turned "on" in response to the dic_1 signal indicating a binary "1" value, and its drain line coupled to the selected memory cell is electrically grounded. In response, a binary value "0" is stored in one of the memory cells 82, 88, 94, 100, 106, 112, 118 selected by the local row decoder 46.

When the dit_n signal indicates a binary "1" value and the dic_n signal indicates a binary "0" value, the field-effect transistors 70, 68, respectively output signals lbl_c_n, lbl_t_n, respectively, having low and high logic levels, respectively. In other words, the field-effect transistor 70 is turned "on" in response to the dit_n signal indicating a binary "1" value, which causes its drain line coupled to a selected memory cell to be electrically grounded. Further, the field-effect transistor 68 is turned "off" in response to the dic_n signal indicating a binary "0" value, and its drain line coupled to the selected memory cell is not electrically grounded. In response, a binary "1" value is stored in one of the memory cells 84, 90, 96, 102, 108, 114, 120 selected by the local row decoder 46.

Alternately, when the dit_n signal indicates a binary "0" value and the dic_n signal indicates a binary "1" value, the field-effect transistors 70, 68, respectively output signals lbl_c_n, lbl_t_n, respectively, having high and low logic levels, respectively. In other words, the field-effect transistor 70 is turned "off" in response to the dit_n signal indicating a binary "0" value, and its drain line coupled to a selected memory cell is not electrically grounded. Further, the field-effect transistor 68 is turned "on" in response to the dic_n signal indicating a binary "1" value, and its drain line coupled to the selected memory cell is electrically grounded. In response, a binary value "0" is stored in one of the memory cells 84, 90, 96, 102, 108, 114, 120 selected by the local row decoder 46.

The memory cell subarray 42 is provided to store binary values therein. In the examplary embodiment, the memory cell subarray 42 comprises a SRAM subarray. Of course, other types of memory arrays known to those skilled in the art could be used in an alternate embodiment. Further, the size of the memory cell subarray 42 (e.g. number of rows and columns of memory cells) can vary.

The signal inverter 44 is electrically coupled between the address decoder 22 and the local write circuit 40. The signal inverter 44 receives a subarray_select_0 signal from the address decoder 22 and outputs the write_0 control signal that is complement of the subarray_select_0 signal. For example, when the subarray_select_0 signal indicates a binary "1" value, the write_0 control signal indicates a binary "0" value, indicating that a write will be performed to the memory cell subarray 42. Alternately, when the subarray_select_0 signal indicates a binary "0" value, the write_0 signal indicates a binary "1" value, indicating that a write will not be performed to the memory cell subarray 42.

The local row decoder 46 is provided to select a row of memory cells in the memory cell subarray 42 that will have binary values written thereto, based on the local_row_address signal received from the address decoder 22. In particular, the local row decoder 46 generates one of the signals R1, R2, R3, R4, R5, R6, R7 having a high logic level. Further, the local row decoder 46 will only generate one of the signals R1, R2, R3, R4, R5, R6, R7 when the subarray_select_0 signal has a high logic level. For example, when the local row decoder 46 generates the signal R1 having a high logic level, the memory cells 80, 82, 84 are selected to store binary values indicated by the local write circuit 40. When the local row decoder 46 generates the signal R2 having a high logic level, the memory cells 86, 88, 90 are selected to store binary values indicated by the local write circuit 40. When the local row decoder 46 generates the signal R3 having a high logic level, the memory cells 92, 94, 96 are selected to store binary values indicated by the local write circuit 40. When the local row decoder 46 generates the signal R4 having a high logic level, the memory cells 98, 100, 102 are selected to store binary values indicated by the local write circuit 40. When the local row decoder 46 generates the signal R5 having a high logic level, the memory cells 104, 106, 108 are selected to store binary values indicated by the local write circuit 40. When the local row decoder 46 generates the signal R6 having a high logic level, the memory cells 110, 112, 114 are selected to store binary values indicated by the local write circuit 40. Finally, when the local row decoder 46 generates the signal R7 having a high logic level, the memory cells 116, 118, 120 are selected to store binary values indicated by the local write circuit 40.

Referring to FIGS. 1A, 11B and 3, the subarray circuit 20 is provided to receive the data signals dit_0, dic_0, dit_1, dic_1, dit_n, and dic_n from the global write circuit 16 and to write the associated binary values to predetermine memory cells in the memory cell subarray 142. The subarray circuit 20 includes a local write circuit 140, a memory cell subarray 142, a signal inverter 144, and a local row decoder 146.

The local write circuit 140 includes the field-effect transistors 160, 162, 164, 166, 168, 170. Each of the field-effect transistors 160–170 includes a gate (G), a source (S), and a drain (D). The sources of the field-effect transistors 160–170 are electrically coupled to the node 172 that is further electrically coupled to an output terminal of the signal inverter 144.

The drains of the transistors 160, 162 are electrically coupled to all of the memory cells in a column of memory cells in the memory cell subarray 142. In particular, the drains of the transistors 160, 162 are electrically coupled to memory cells 180, 186, 192, 198, 204, 210, 216 in the memory cell subarray 142, one of which is selected by the local row decoder 146. For example, if the local row decoder 146 generates a signal R8 with a high logic level (e.g., a binary "1" value), a binary value will be written to the memory cell 180 when the write_1 signal indicates that a write to the memory cell subarray 142 is to be performed.

The drains of the transistors 164, 166 are electrically coupled to all of the memory cells in a column of memory cells in the memory cell subarray 142. In particular, the drains of the transistors 164, 166 are electrically coupled to memory cells 182, 188, 194, 200, 206, 212, 218 in the memory cell subarray 142, one of which is selected by the local row decoder 146. For example, if the local row decoder 146 generates a signal R9 with a high logic level, a binary value will be written to the memory cell 188 when the write_1 signal indicates that a write to the memory cell subarray 142 is to be performed.

The drains of the transistors 168, 170 are electrically coupled to all of the memory cell in a column of memory cells in the memory cell subarray 142. In particular, the drains of the transistors 168, 170 are electrically coupled to memory cells 184, 190, 196, 202, 208, 214, 220 in the memory cell subarray 142, one of which is selected by the local row decoder 146. For example, if the local row decoder 146 generates a signal RIO with a high logic level, a binary value will be written to the memory cell 196 when the write_1 signal indicates that a write to the memory cell subarray 142 is to be performed.

When the write_1 signal from the signal inverter 144 indicates a binary "0" value, a write will be performed to the memory cell subarray 142. Thereafter, when the dit_0 signal indicates a binary "1" value and the dic_0 signal indicates a binary "0" value, the field-effect transistors 162, 160, respectively output signals lbl_c_2, lbl_t_2, respectively, having low and high logic levels, respectively. In other words, the field-effect transistor 162 is turned "on" in response to the dit_0 signal indicating a binary "1" value, which causes its drain line coupled to a selected memory cell to be electrically grounded. Further, the field-effect transistor 160 is turned "off" in response to the dic_0 signal indicating a binary "0" value, and its drain line coupled to the selected memory cell is not electrically grounded. In response, a binary "1" value is stored in one of the memory cells 180, 186, 192, 198, 204, 210, 216 selected by the local row decoder 146.

Alternately, when the dit_0 signal indicates a binary "0" value and the signal dic_0 signal indicates a binary "1" value, the field-effect transistors 162, 160, respectively output signals lbl_c_2, lbl_t_2, respectively, having high and low logic levels, respectively. In other words, the field-effect transistor 162 is turned "off" in response to the dit_0 signal indicating a binary "0" value, and its drain line coupled to a selected memory cell is not electrically grounded. Further, the field-effect transistor 160 is turned "on" in response to the dic_0 signal indicating a binary "1" value, and its drain line coupled to the selected memory cell is electrically grounded. In response, a binary value "0" is stored in one of the memory cells 180, 186, 192, 198, 204, 210, 216 selected by the local row decoder 146.

When the dit_1 signal indicates a binary "1" value and the dic_1 signal indicates a binary "0" value, the field-effect transistors 166, 164, respectively output signals lbl_c_3, lbl_t_3, respectively, having low and high logic levels, respectively. In other words, the field-effect transistor 166 is turned "on" in response to the dit_1 signal indicating a binary "1" value, which causes its drain line coupled to a selected memory cell to be electrically grounded. Further, the field-effect transistor 164 is turned "off" in response to the dic_1 signal indicating a binary "0" value, and its drain line coupled to the selected memory cell is not electrically grounded. In response, a binary "1" value is stored in one of the memory cells 182, 188, 194, 200, 206, 212, 218 selected by the local row decoder 146.

Alternately, when the dit_1 signal indicates a binary "0" value and the signal dic_1 signal indicates a binary "1" value, the field-effect transistors 166, 164, respectively output signals lbl_c_3, lbl_t_3, respectively, having high and low logic levels, respectively. In other words, the field-effect transistor 166 is turned "off" in response to the dit_1 signal indicating a binary "0" value, and its drain line coupled to a selected memory cell is not electrically grounded. Further, the field-effect transistor 164 is turned "on" in response to the dic_1 signal indicating a binary "1" value, and its drain line coupled to the selected memory cell is electrically grounded. In response, a binary value "0" is stored in one of the memory cells 182, 188, 194, 200, 206, 212, 218 selected by the local row decoder 146.

When the dit_n signal indicates a binary "1" value and the dic_n signal indicates a binary "0" value, the field-effect transistors 170, 168, respectively output signals lbl_c_m, lbl_t_m, respectively, having low and high logic levels, respectively. In other words, the field-effect transistor 170 is turned "on" in response to the dit_m signal indicating a binary "1" value, which causes its drain line coupled to a selected memory cell to be electrically grounded. Further, the field-effect transistor 168 is turned "off" in response to the dic_n signal indicating a binary "0" value, and its drain line coupled to the selected memory cell is not electrically grounded. In response, a binary "1" value is stored in one of the memory cells 184, 190, 196, 202, 208, 214, 220 selected by the local row decoder 146.

When the dit_n signal indicates a binary "0" value and the dic_n signal indicates a binary "1" value, the field-effect transistors 170, 168, respectively output signals lbl_c_m, lbl_t_m, respectively, having high and low logic levels, respectively. In other words, the field-effect transistor 170 is turned "off" in response to the dit_n signal indicating a binary "0" value, and its drain line coupled to a selected memory cell is not electrically grounded. Further, the field-effect transistor 168 is turned "on" in response to the dic_n signal indicating a binary "1" value, and its drain line coupled to the selected memory cell is electrically grounded. In response, a binary value "0" is stored in one of the memory cells 184, 190, 196, 202, 208, 214, 220 selected by the local row decoder 146.

The memory cell subarray 142 is provided to store binary values therein. In the examplary embodiment, the memory cell subarray 142 comprises a SRAM subarray. Of course other types of memory arrays known to those skilled in the art could be used in alternate embodiments. Further, the size of the memory cell subarray 142 (e.g. number of rows and columns of memory cells) can vary.

The signal inverter 144 is electrically coupled between the address decoder 22 and the local write circuit 140. The signal inverter 144 receives a subarray_select_1 signal from the address decoder 22 and outputs the write_1 signal that is complement of the subarray_select_1 signal. For example, when the subarray_select_1 signal indicates a binary "1" value, the write_1 signal indicates a binary "0" value, indicating that a write will be performed to the memory cell subarray 142. Alternately, when the subarray_select_1 signal indicates a binary "0" value, the write_1 control signal indicates a binary "1" value, indicating that a write will not be performed to the memory cell subarray 142.

The local row decoder 146 is provided to select a row of memory cells in the memory cell subarray 142 that will have binary values written thereto, based on the local_row_address signal received from the address decoder 122. In particular, the local row decoder 46 generates one of the signals R8, R9, R10, R11, R12, R13, R14 having a high logic level. Further, the local row decoder 146 will generate one of the signals R8, R9, R10, R11, R12, R13, R14 when the subarray_select_1 signal has a high logic level. For example, when the local row decoder 146 generates the signal R8 having a high logic level, the memory cells 180, 182, 184 are selected to store binary values indicated by the local write circuit 140. When the local row decoder 146 generates the signal R9 having a high logic level, the memory cells 186, 188, 190 are selected to store binary values indicated by the local write circuit 140. When the local row decoder 146 generates the signal R10 having a high logic level, the memory cells 192, 194, 196 are selected to store binary values indicated by the local write circuit 140. When the local row decoder 146 generates the signal R11 having a high logic level, the memory cells 198, 200, 202 are selected to store binary values indicated by the local write circuit 140. When the local row decoder 146 generates the signal R12 having a high logic level, the memory cells 204, 206, 208 are selected to store binary values indicated by the local write circuit 140. When the local row decoder 146 generates the signal R13 having a high logic level, the memory cells 210, 212, 214 are selected to store binary values indicated by the local write circuit 140. Finally, when the local row decoder 146 generates the signal R14 having a high logic level, the memory cells 216, 218, 220 are selected to store binary values indicated by the local write circuit 140.

The address decoder 22 is provided to select which of the memory cell arrays 42, 142 will be written to. In particular, the address decoder 22 generates (i) the subarray_select_0 signal having a high logic level indicating that the memory cell subarray 42 will store binary values received from the local write circuit 40, and/or (ii) the subarray_select_1 signal having a high logic level indicating that the memory cell subarray 142 will store binary values received from the local write circuit 140. The address decoder 22 is further provided to (i) select the row of memory cells in the memory cell subarray 42, and to (ii) select the row of memory cells in memory cell subarray 142 that will be written to. In particular, the address decoder 22 generates the local_row_address signal which indicates the row of memory cells that will be written to, that is received by the local row decoders 46, 146 of the subarray circuits 18, 20, respectively.

The local write circuits 40, 140 and the method for writing binary values to one or more memory cell arrays represents a substantial advantage over other devices and methods. In particular, the circuits 40, 140 and the method provide a technical effect of allowing the field-effect transistors in only one of the circuits 40, 140 to electrically ground memory cells operably coupled thereto, during a write cycle. Accordingly, electrical energy is conserved during each write cycle, as compared to other devices that electrically ground memory cells in multiple memory arrays during a write cycle.

While the invention is described with reference to an exemplary embodiment, it will be understood by those skilled in the art that various changes may be made an equivalence may be substituted for elements thereof without departing from the scope of the invention. In addition, many modifications may be made to the teachings of the invention to adapt to a particular situation without departing from the scope thereof. Therefore, is intended that the invention not be limited the embodiment disclosed for carrying out this invention, but that the invention includes all embodiments falling with the scope of the intended claims. Moreover, the use of the term's first, second, etc. does not denote any order of importance, but rather the term's first, second, etc. are us are used to distinguish one element from another.

We claim:

1. A circuit for writing a binary value to a memory cell, comprising:
    a first field-effect transistor having a first drain, a first source, and a first gate operably coupled between the first drain and the first source, the first drain being operably coupled to a first memory cell, the first gate configured to receive a first data signal;
    a second field-effect transistor having a second drain, a second source, and a second gate operably coupled between the second drain and the second source, the second drain being operably coupled to the first memory cell, the second gate configured to receive a second data signal; and
    a first signal inverter having a first input terminal and a first output terminal, the first output terminal being operably coupled to both of the first and second sources, the first signal inverter being configured to output a first control signal on the first output terminal when the first input terminal receives a second control signal, wherein when the first control signal has a second logic level and the first data signal has a first logic level and the second data signal has the second logic level, the first and second field-effect transistors induce the first memory cell to store a first binary value.

2. The circuit of claim 1, wherein the first logic level corresponds to a binary 1 value and the second logic level corresponds to a binary 0 value.

3. The circuit of claim 1, wherein the first binary value comprises a binary 1 value.

4. The circuit of claim 1, wherein when the first control signal has the second logic level, the first and second field-effect transistors do not induce the first memory cell to store the first binary value.

5. The circuit of claim 4, wherein the second binary value comprises a binary 0 value.

6. The circuit of claim 1, wherein the first memory cell comprises a SRAM memory cell.

7. The circuit of claim 4, further comprising:
    a third field-effect transistor having a third drain, a third source, and a third gate operably coupled between the third drain and the third source, the third drain being operably coupled to a second memory cell, the third gate configured to receive the first data signal;
    a fourth field-effect transistor having a fourth drain, a fourth source, and a fourth gate operably coupled between the fourth drain and the fourth source, the fourth drain being operably coupled to the second memory cell, the fourth gate configured to receive the second data signal; and
    a second signal inverter having a second input terminal and a second output terminal, the second output terminal being operably coupled to both of the third and fourth sources, the second signal inverter being configured to output a third control signal on the second output terminal when the second input terminal receives a fourth control signal, wherein when the third control signal has the first logic level, the third and fourth field-effect transistors do not induce the second memory cell to store the first binary value.

8. The circuit of claim 4, further comprising:
    a third field-effect transistor having a third drain, a third source, and a third gate operably coupled between the third drain and the third source, the third drain being operably coupled to a second memory cell, the third gate configured to receive a third data signal;
    a fourth field-effect transistor having a fourth drain, a fourth source, and a fourth gate operably coupled between the fourth drain and the fourth source, the fourth drain being operably coupled to the second memory cell, the fourth gate configured to receive a fourth data signal; and
    the first output terminal of the first signal inverter being operably coupled to both of the third and fourth sources, wherein when the first control signal has the second logic level and the third data signal has the first logic level and the fourth data signal has the second logic level, the third and fourth field-effect transistors induce the second memory cell to store the first binary value.

9. The circuit of claim 1, wherein the second data signal is a logically complemented signal of the first data signal.

10. A method for writing a binary value to a memory cell utilizing a circuit, the circuit having a first field-effect transistor, a second field-effect transistor, and a first signal inverter, the first field-effect transistor having a first drain, a first source, and a first gate operably coupled between the first drain and the first source, the first drain being operably coupled to a first memory cell, the second field-effect transistor having a second drain, a second source, and a second gate operably coupled between the second drain and the second source, the second drain being operably coupled to the first memory cell, the first signal inverter having a first input terminal and a first output terminal, the first output terminal being operably coupled to the first and second sources of the first and second field-effect transistors, the method comprising:
    receiving a first data signal having a first logic level at the first gate of the first field-effect transistor;
    receiving a second data signal having a second logic level at the second gate of the second field-effect transistor; and
    outputting a first control signal having the second logic level on the first output terminal of the first signal inverter when the first input terminal receives a second control signal, that induces the first and second field-effect transistors to store a first binary value in the first memory cell based on the first and second data signals.

11. The method of claim 10, wherein the first logic level corresponds to a binary 1 value and the second logic level corresponds to a binary 0 value.

12. The method of claim 10, wherein the first binary value comprises a binary 1 value.

13. The method of claim 10, further comprising:
    inducing the first and second field-effect transistors to store a second binary value in the first memory cell when the first control signal has the second logic level and the first data signal has the second logic level and the second data signal has the first logic level.

14. The method of claim 13, wherein the second binary value comprises a binary 0 value.

15. The method of claim 10, wherein the first memory cell comprises a SRAM memory cell.

* * * * *